United States Patent [19]
Edo

[11] Patent Number: 5,225,686
[45] Date of Patent: Jul. 6, 1993

[54] POSITIONING METHOD AND POSITIONING MECHANISM FOR USE IN EXPOSURE APPARATUS

[75] Inventor: Ryo Edo, Tokyo, Japan
[73] Assignee: Canon Kabushiki Kaisha, Tokyo, Japan
[21] Appl. No.: 757,310
[22] Filed: Sep. 10, 1991
[30] Foreign Application Priority Data
Sep. 12, 1990 [JP] Japan .................. 2-240088
[51] Int. Cl.$^5$ .......................................... G01N 21/86
[52] U.S. Cl. .................................... 250/548; 356/401
[58] Field of Search .............. 250/548, 557, 561; 356/400, 401

[56] References Cited
U.S. PATENT DOCUMENTS

| 4,171,162 | 10/1979 | Gerard et al. | 356/401 |
| 4,902,900 | 2/1990 | Kamiya et al. | 250/548 |
| 4,999,669 | 3/1991 | Sakamoto et al. | 356/400 |
| 5,011,282 | 4/1991 | Ream et al. | 356/400 |

FOREIGN PATENT DOCUMENTS
1193689 8/1989 Japan.

Primary Examiner—David C. Nelms
Attorney, Agent, or Firm—Fitzpatrick, Cella, Harper & Scinto

[57] ABSTRACT

An alignment detecting method in which alignment detection for a mask and a wafer is effected by using an alignment beam projected from an alignment unit. According to this method, the attitude of the alignment unit is detected and an angle of projection of the alignment beam is adjusted o the basis of the attitude detection. Then, alignment detection for the mask and t he wafer is effected by using the angle-adjusted alignment beam.

11 Claims, 12 Drawing Sheets

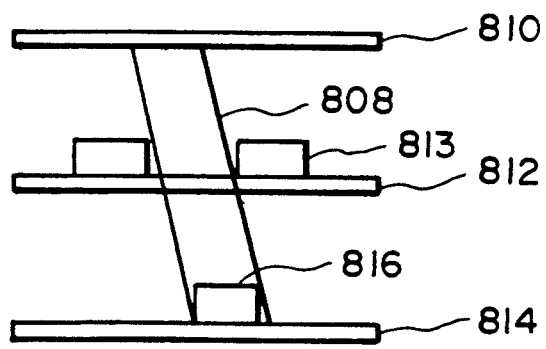
F I G. 13A
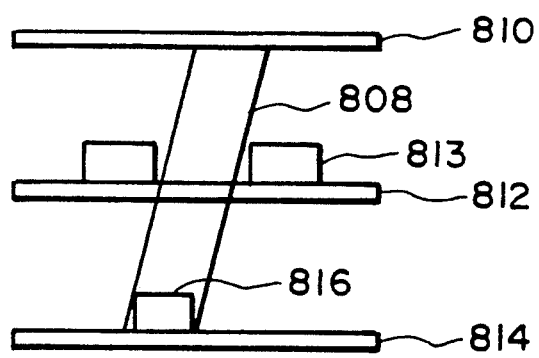
F I G. 13B
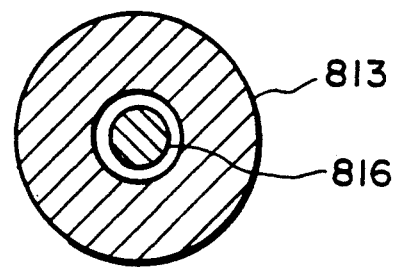
F I G. 13C

POSITIONING METHOD AND POSITIONING MECHANISM FOR USE IN EXPOSURE APPARATUS

FIELD OF THE INVENTION AND RELATED ART

This invention relates to an exposure apparatus and, more particularly, to a positioning mechanism in an exposure apparatus, for precisely positioning a mask and a wafer.

Japanese Laid-Open Patent Application, Laid-Open No. 1-193689 filed in the name of the assignee of the subject application shows an example of such positioning mechanism. In this example, a detecting mechanism is provided on a movable table which is movable relative to an article (mask or wafer, for example) to be positioned, and a cross roller guide which provides means for driving the movable table comprises an orthogonal dual axis guide mechanism.

FIGS. 13A-13C are representations for explaining the operation for positioning detection in a known example. Alignment signal sensor 810 shown in FIGS. 13A or 13B is accommodated in an alignment unit which is mounted on such a movable table as described above. It is used to discriminate accomplishment of alignment when alignment marks 813 and 816 formed on a mask 812 and a wafer 814 are brought into such positional relationship as shown in FIG. 13C. Their relationship can be checked by using an alignment beam 808 projected from the alignment signal detecting sensor 810 side.

FIGS. 13A and 13B illustrate examples wherein alignment beams 808 for effecting the alignment operation are inclined in different directions. In each of the FIGS. 13A and 13B, a pattern representing the accomplishment of alignment such as shown in FIG. 13C is formed on the alignment signal detecting sensor 810. Actually, however, the positional relation of the mask 812 and the wafer 814 is different between the case shown in FIG. 13A and the case shown in FIG. 13B. If, therefore, exposures are effected to the mask and the wafer under these conditions, respectively, there arises a deviation between an already printed pattern and a pattern to be printed.

The inclination of the alignment beam as described may result from a change in attitude of the movable table which supports the alignment unit.

FIGS. 14A and 14B are representations for explaining the inclination of an alignment beam. FIG. 14A shows a case where an alignment beam is projected normally (perpendicularly) whereas FIG. 14B shows a case where an alignment beam is projected obliquely. Among changes in attitude, a rotational quantity wx about an X axis is illustrated in the figures. Denoted at 910 is an X-Y stage (movable table); at 903 is a base for supporting the X-Y stage 901; denoted at 908 is an alignment beam emitted by a laser diode 909 accommodated in an alignment unit 911; and denoted at 913 and 916 are alignment marks formed on a mask 912 and a wafer 914. The alignment unit 911 also accommodates therein an alignment signal detecting sensor (not shown) such as that shown in FIG. 13A or 13B, which is disposed at a position for receiving reflection light of the alignment beam 908.

In the following explanation, it is assumed for simplification that the alignment beam 908 is projected perpendicularly.

When the alignment unit 911 inclines from the state shown in FIG. 14A by an angle $\theta$ as shown in FIG. 14B with movement of the X-Y stage 901, the alignment beam 908 projected from the alignment unit 901 also inclines by an angle $\theta$. If in this case the angle $\theta = 20''$, the spacing G between the laser diode 909 and the alignment mark 913 is 50 mm, and if the spacing g between the alignment marks 913 and 916 is 50 microns, then the beam spot as formed on the mask 912 by the alignment beam 908 displaced by 5 microns leftwardly as viewed in the figure, irrespective of the fact that the alignment unit 911 is at a preset site. This causes an apparent positional deviation of 0.005 micron between the mask 912 and the wafer 914.

SUMMARY OF THE INVENTION

It is accordingly a primary object of the present invention to provide a positioning mechanism for use in an exposure apparatus, for example, by which any change in attitude of an alignment unit can be detected and by which any change in attitude thereof can be corrected.

In accordance with an aspect of the present invention, there may be provided a positioning method or mechanism for use in an exposure apparatus, wherein an alignment beam projected from an alignment unit is used for positioning of a mask and a wafer, an important feature residing in the provision of an alignment unit measuring means for measuring the quantity of a change in attitude of the alignment unit with respect to the exposure apparatus. On the basis of the quantity of change in attitude as measured by the alignment unit measuring means, the attitude of the alignment unit or the angle of projection of the alignment beam may be corrected.

In this case, an attitude adjusting means for adjusting the attitude of the alignment unit may be provided, such that the attitude of the alignment unit may be corrected by the attitude adjusting means in accordance with the quantity of change in attitude as measured by the alignment unit measuring means and after that the positioning of the mask and the wafer may be effected.

In a positioning mechanism according to this method, the alignment unit measuring means may be provided by an auto-collimator or a laser distance measuring device, while the attitude adjusting means may comprise a correction stage disposed at a lower portion of the alignment unit, with the operations of these devices being controlled by a controller.

The quantity of change in attitude of the alignment unit can be measured through the alignment unit measuring means and the attitude of the alignment unit can be corrected on the basis of the measured quantity of attitude change. Accordingly, where plural masks are used, repetition of such attitude correction will assure a fixed positional relationship between the alignment beam projected from the alignment unit and the mask or the wafer.

Where attitude adjusting means is provided, the attitude of the alignment unit can be corrected on the basis of the quantity of change in attitude as measured through the alignment unit measuring means. As a result, the position of the alignment beam projected by the alignment unit can be continuously held fixed.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 13A–13C are schematic views, respectively, for explaining different states of mask-to-wafer alignment in a known example.

DESCRIPTION OF THE PREFERRED EMBODIMENTS

Figure 1:
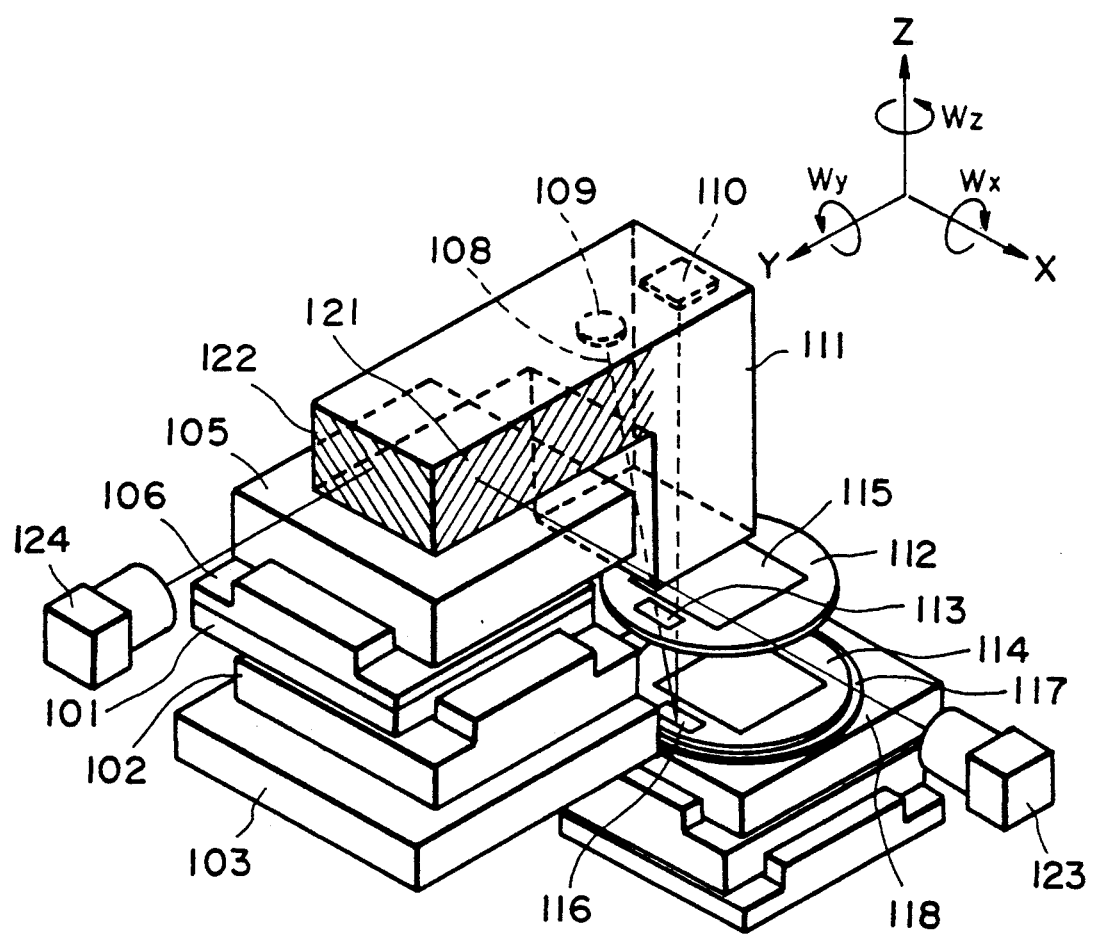
FIG. 1 is a perspective view showing a main structural portion of a first embodiment according to the present invention.

FIG. 1 is a perspective view showing a main structural portion of a first embodiment of the present invention.

Denoted in the drawing at 101 is a movable guide which is movable in the X direction, and denoted at 102 is a fixed guide which is fixedly provided on a base 103. The movable guide 101 and the fixed guide 102 cooperate to provide an X-axis cross roller guide means. On the other hand, a Y-axis cross roller guide means is provided by a movable guide 105 and a fixed guide 106, and it is mounted on the movable guide 101. These X-axis and Y-axis cross roller guides constitute an X-Y stage. Motor means for driving the movable guide 101 or 105, and linear encoder means for detecting the quantity of movement by the motor means are provided, but they are not shown in the drawing. Alignment unit 111 is mounted on the movable guide 105 and is movable in the X and Y directions. It accommodates therein a laser diode 109 for emitting an alignment beam 108, an alignment signal detecting sensor 110 for receiving reflection light of the alignment beam 108, and an alignment optical system (not shown) for projection and reception of the alignment light 108.

Mask 112 and wafer 114 are to be aligned with each other in the present embodiment, and they have formed thereon alignment marks 113 and 116, respectively, for an alignment purpose. The mask 112 also has formed thereon a mask pattern 115 which is to be printed on the wafer 114. The wafer 114 positioned below is held through attraction by a wafer chuck 117 which is mounted on a wafer stage 118. With the motion of the wafer stage 118, the wafer can be moved in the X and Y directions. The mask 112 is placed above the wafer 114, and it is held by a mask holder (not shown) with a constant spacing from the wafer 114.

The alignment unit 111 includes an X-axis reflecting portion 121 (a surface perpendicular to the X axis) and a Y-axis reflecting portion 122 (a surface perpendicular to the Y axis). Two auto-collimators 123 and 124 are disposed to be opposed to the X-axis reflecting portion 121 and the Y-axis reflecting portion 122, respectively, for detecting a change in attitude of the alignment unit 111. The auto-collimator 123 serves to detect the quantity (wy) of rotation about the Y axis in FIG. 1 as well as the quantity (wz) of rotation about the Z axis. The auto-collimator 124 serves to detect the quantity (wx) of rotation about the X axis. These auto-collimators 123 and 124 are provided integrally with the mask holder, and they are mounted on an auto-collimator base (not shown) which is fixedly provided in the exposure apparatus. Thus, any change in attitude (quantity of rotation) of the alignment unit as detected by the auto-collimator 123 or 124 is with reference to the exposure apparatus.

In this embodiment as described, the auto-collimators 123 and 124 and the X-axis and Y-axis reflecting portions 121 and 122 serve to provide an alignment unit measuring means.

Figure 14A:
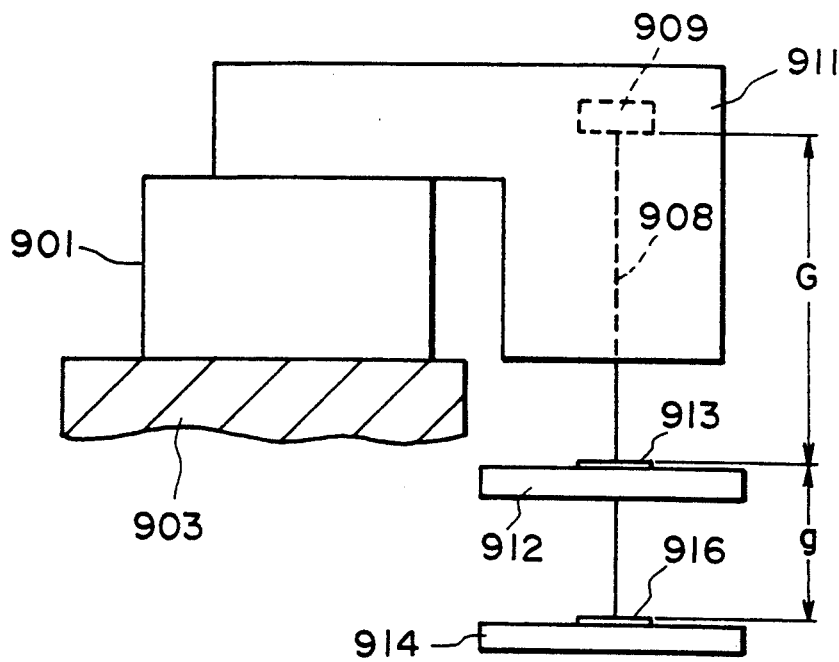
FIGS. 14A and 14B are fragmentary views, respectively, for explaining the inclination of an alignment unit in a known example.
Figure 14B:
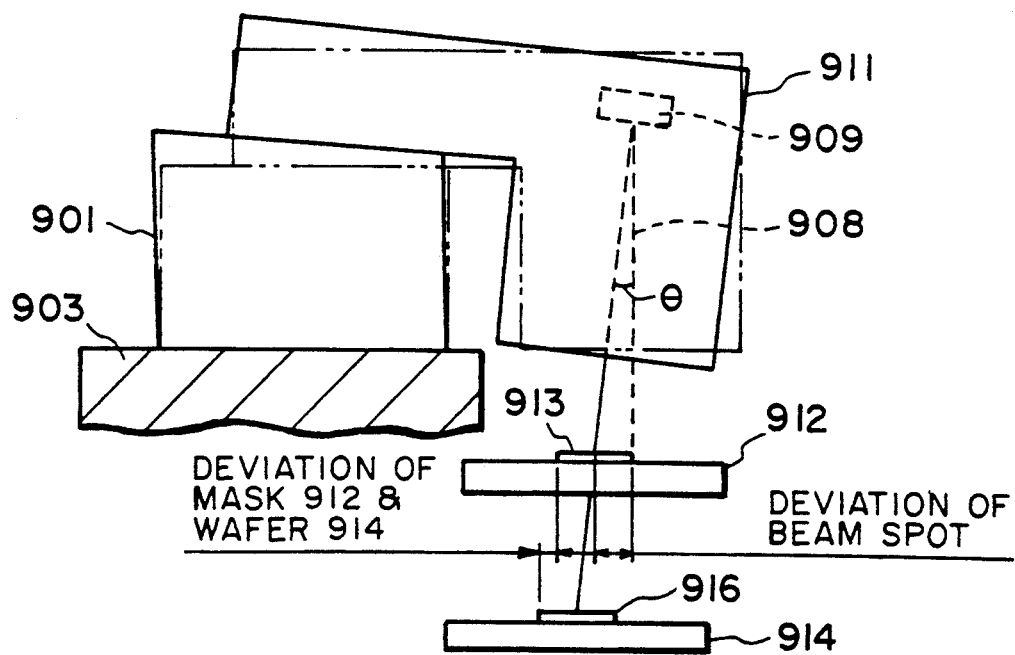

As regards a deviation resulting from inclination of the alignment beam, there is a "beam spot deviation" in which the beam spot displaced and "mask-to-wafer deviation" in which the relative position of the mask and the wafer changes (FIGS. 14A and 14B). The beam spot deviation can result not only from the inclination of the alignment beam but also from an error in the quantity of movement of the pickup. In the present invention, a particular note has been taken of such "beam spot deviation".

In the following description of the present embodiment, like the example shown in FIGS. 14A and 14B, for simplification it is assumed that the alignment beam 108 is projected normally perpendicularly to the X-Y plane or the surface of the mask 112.

If the alignment unit 111 inclines and the projected alignment beam 108 inclines, then a resultant deviation attributable to the rotational quantities wx and wy is such as described with reference to FIGS. 14A and 14B. On the other hand, the quantity of deviation of the beam spot resulting from the rotational quantity wz is equal to "(the distance from the center of rotation wz of the attitude change to the laser diode 109)×(the quantity of rotation wz)". If the alignment beam 108 is projected with a predetermined angle $\phi$ with respect to a normal, the rotation of a quantity wz causes a mask-to-wafer deviation of a quantity equal to "(the spacing g between the mask 112 and the wafer 114)×wz×tanφ".

Driving of the stage and detecting any change in attitude of the alignment unit 111 as well as the alignment operation are all controlled by a control device (not shown).

Figure 2:
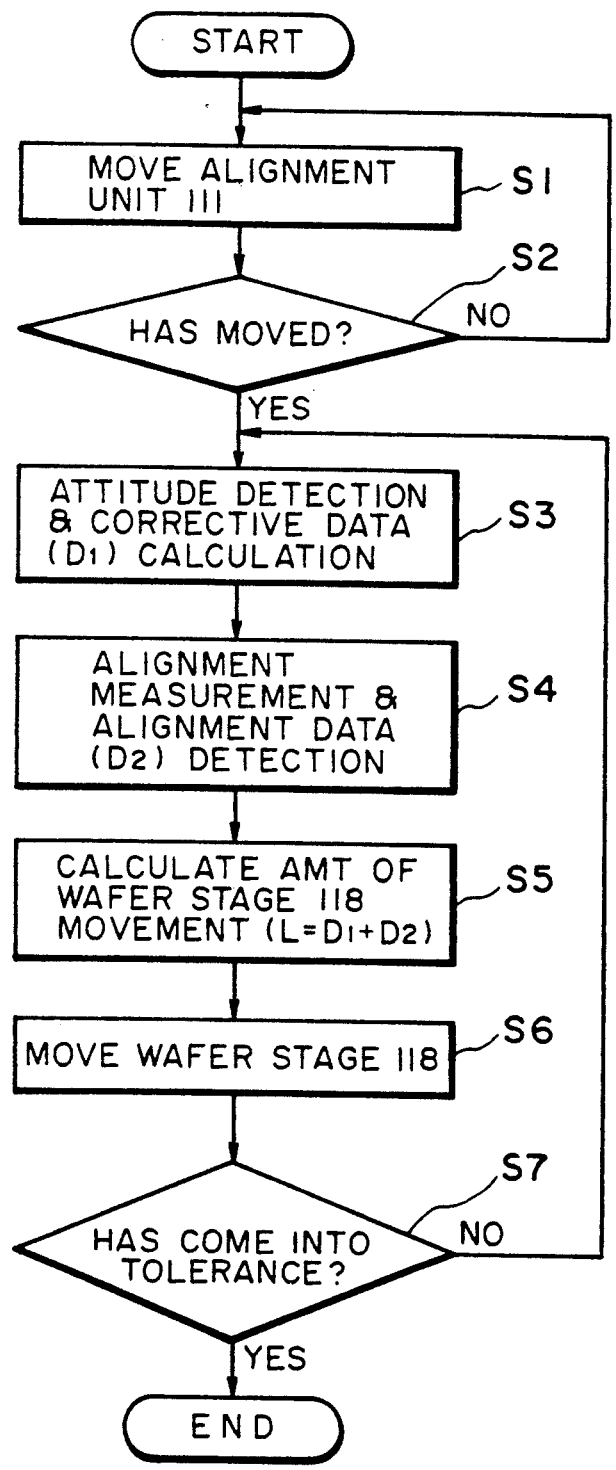
FIG. 2 is a flow chart for explaining the control operation of the first embodiment of the present invention.

FIG. 2 is a flow chart for explaining the control for the alignment operation, by the control device.

In response to the input of start of a alignment operation, the control device moves the alignment unit 111 (step S1). Then, a discrimination is made as to whether the alignment unit 111 has moved to a predetermined position for detecting the alignment marks 113 and 116 of the mask 112 and the wafer 114 to be aligned (step S2). Subsequently, the rotational quantities wx, wy and wz of the alignment unit 111 are detected from the outputs of the auto-collimators 123 and 124, and the change in attitude of the alignment unit is determined. Here, from the detected quantities wx, wy and wz, an error D1 in the measurement of deviation of the mask 112 and the wafer 114, attributable to the change in attitude of the alignment unit, is calculated as corrective data (step S3). After this, a similar alignment measurement process as that in the FIG. 13 example is effected, whereby alignment data D2 is obtained (step S4). Subsequently, a quantity (L) of movement of the wafer stage 118, which corresponds to the sum of the alignment data D1 and the alignment data D2, is calculated (step S5) and the wafer stage 118 is moved through an amount corresponding to the quantity L (step S6). Then, whether the mask 112 and the wafer 114 ar in such positional relationship which is satisfactory for execution of the exposure process, is discriminated on the basis of the state of light reception upon the alignment signal detecting sensor 110. If so, then the operation is finished. If not, measurement of the attitude of the alignment unit 111 and the operations following it are repeated (step S7).

In the present embodiment as described, the wafer 114 is displaced in accordance with the quantity of change in attitude of the alignment unit 111. Therefore, the mask and the wafer being aligned with each other can be held in substantially the same positional relationship, constantly.

Figure 3:
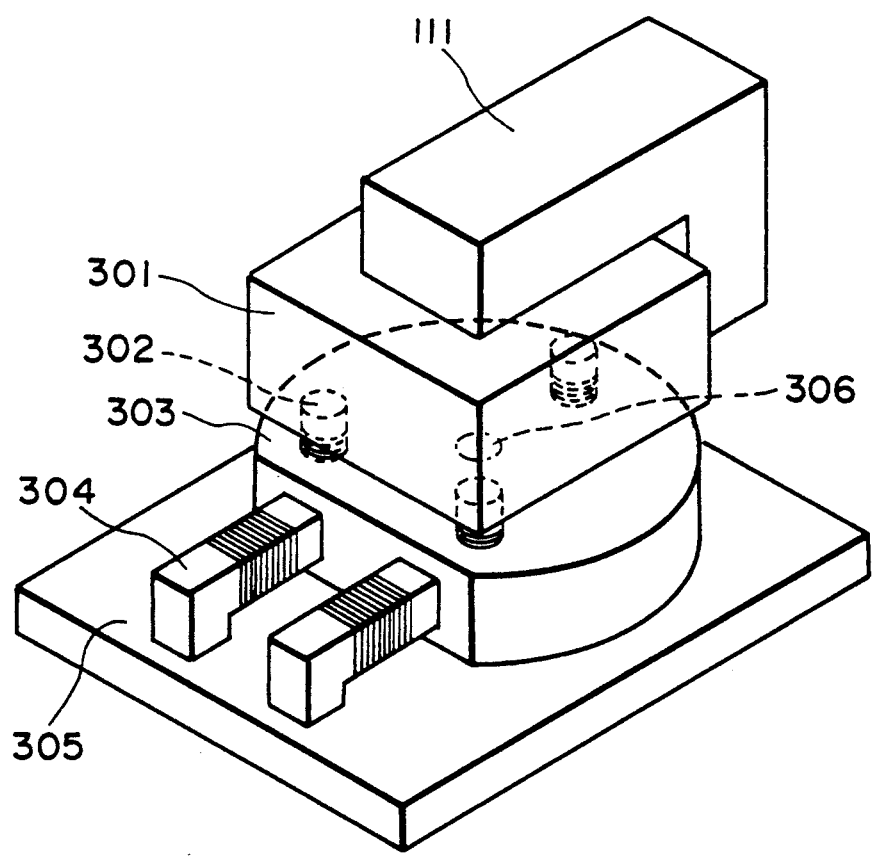
FIG. 3 is a perspective view showing a main structural portion of a second embodiment according to the present invention.
Figure 4:
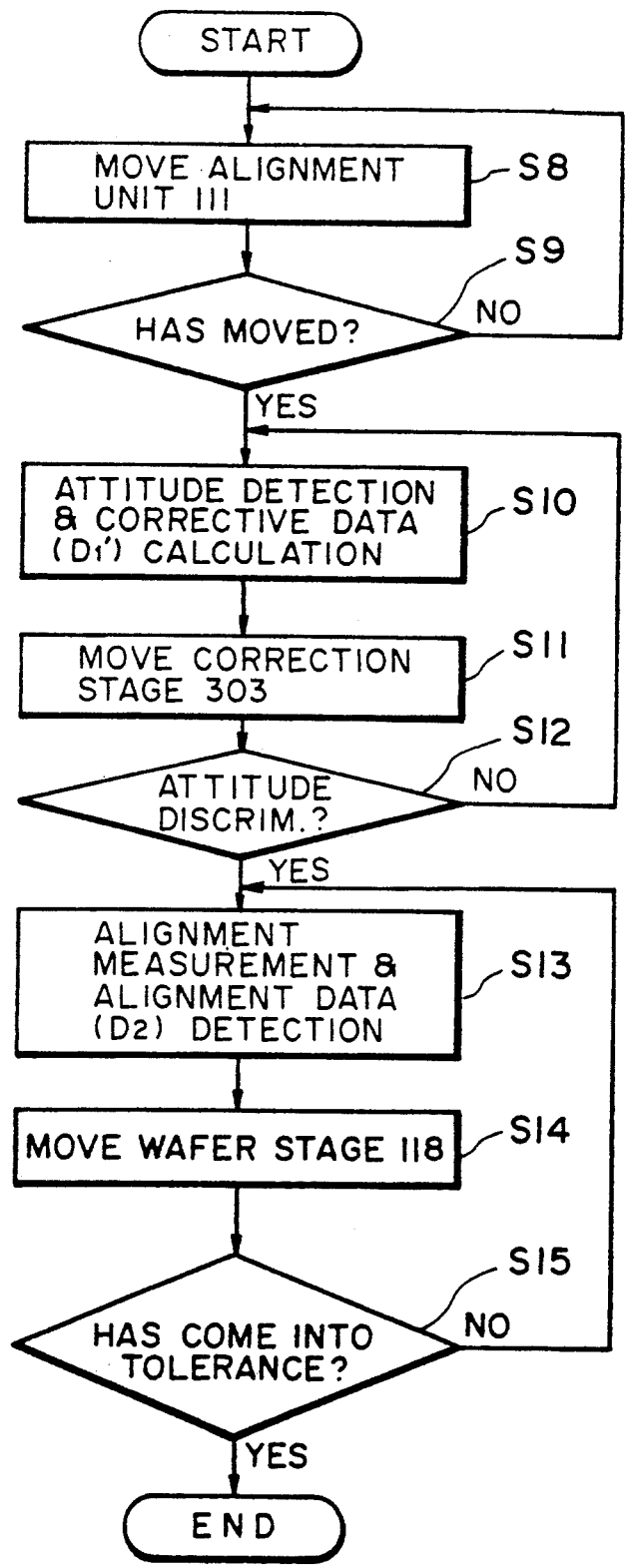
FIG. 4 is a flow chart for explaining the control operation of the second embodiment of the present invention.

FIG. 3 is a perspective view showing a main structural portion of a second embodiment of the present invention, and FIG. 4 is flow chart for explaining the control operation of this embodiment.

In this embodiment, a correction stage 303 is provided as an adjusting means for correcting the inclination of the alignment unit 111, if any. In FIG. 3, X-Y stage 301 comprises movable guides such as shown at 101 and 105 in FIG. 1, as well as fixed guides such as shown at 102 and 106 in FIG. 1. The X-Y stage 301 is supported by the correction stage 303 through a three-point support by three tilt screws 302 each for upward/downward motion. The correction stage 303 is mounted on a correction stage base 305, and it is rotatable about a rotational shaft 306 through press engagement by two expansible/contractable piezoelectric devices 304. The remaining portion of this embodiment has a similar structure as the FIG. 1 embodiment, and an illustration and a description thereof will be omitted here.

With the arrangement described above, if the alignment unit 111 inclines, with regard to the rotations wx and wy it can be corrected by means of the tilt screws 302 while with regard to the rotation wz it can be corrected by means of the piezoelectric devices 304.

The operation of this embodiment will now be explained with reference to FIG. 4.

In response to the start of the alignment operation, as in the FIG. 1 embodiment, the control device moves the alignment unit 111 to a predetermined position (steps S8 and S9). In this state, the quantity D1' of change in attitude of the alignment unit 111 is calculated as a corrective data (step S10). Then, corresponding one or ones of the tile screws 302 and/or corresponding one or both of the piezoelectric devices 304 are actuated to displace the correction stage 303, to correct the inclination of the alignment unit 111 (step S11). Here, the order of actuation is such that: first the piezoelectric device or devices 304 are operated to correct the rotation wz, and then the tilt screw or screws 302 are operated to correct the rotations wx and wy. After the correction is completed, the attitude of the alignment unit 111 is checked again and whether it is within a range of tolerance is discriminated (step S12). If not, the calculation of corrective data D' as well as actuation of the correction stage 303 are repeated. If the attitude correction of the alignment unit is completed, then alignment measurement is effected, whereby alignment data D2 is obtained (step S13). Based on the obtained alignment data D2, the wafer stage 118 (FIG. 1) is driven (step S14). Then, a discrimination is made as to whether the current positional relationship is within a range of tolerance for the exposure process (step S15). If so, the operation is finished. If not, the alignment measurement as well as the driving of the wafer stage 118 are repeated.

In this embodiment, any inclination of the alignment unit 111 can be corrected and the alignment beam 108 (FIG. 1) projected by the alignment unit can be held fixed, continuously. Therefore, it is possible to attain enhanced positioning precision.

Figure 5:
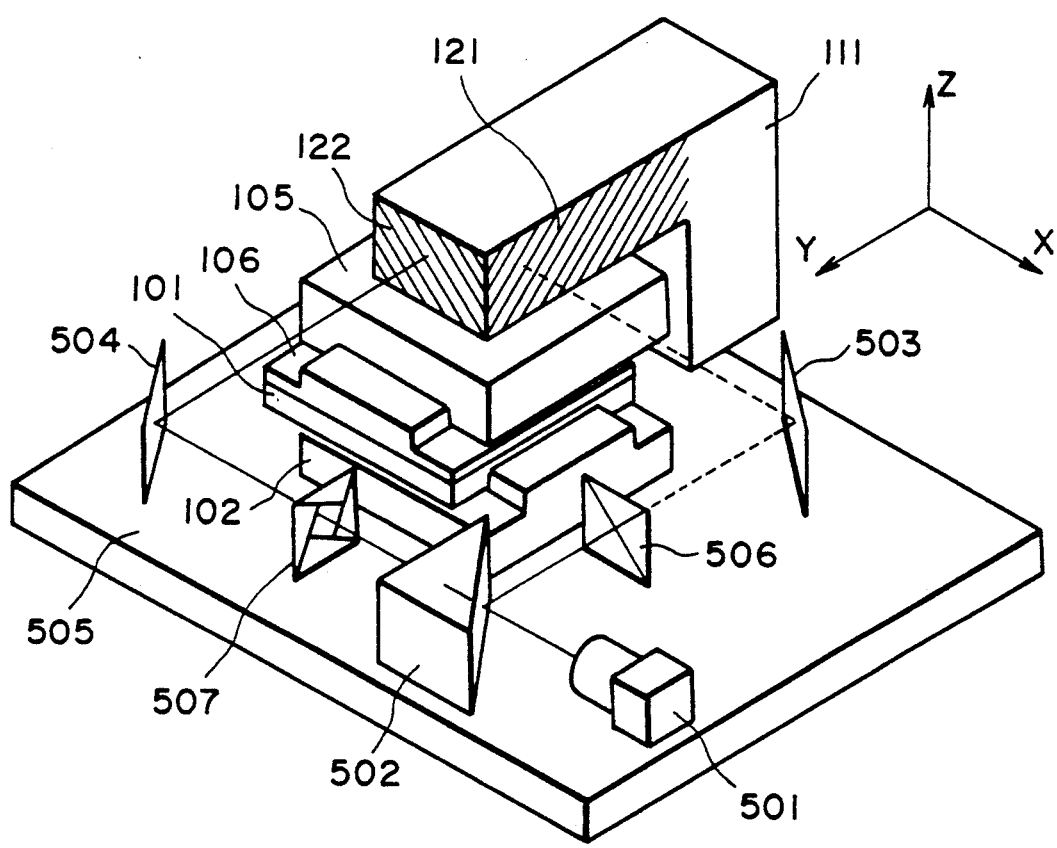
FIG. 5 is a perspective view showing a main structural portion of a third embodiment according to the present invention.

FIG. 5 is a perspective view showing a main structural portion of a third embodiment of the present invention.

In the first and second embodiments, the alignment unit measuring means comprises two auto-collimators for detecting a change in attitude of the alignment unit 111. In the present embodiment, only one auto-collimator is used to detect a change in attitude of the alignment unit 111. FIG. 5 shows only such portion as necessary for the attitude change detection, and the remaining portion is not illustrated.

Denoted in the drawing at 501 is an auto-collimator; denoted at 502 is a half mirror for dividing into two the light emanating from the auto-collimator 501; denoted at 503 and 504 are mirrors each for reflecting one of the divided lights from the half mirror toward an X-axis reflecting portion 121 or a Y-axis reflecting portion 122; and denoted at 506 and 507 are shutters which are provided on a light path between the half mirror 502 and the mirror 503 and on a light path between the half mirror 502 and the mirror 504, respectively. The auto-collimator 501, the half mirror 502, the mirrors 503 and 504 and the shutters 506 and 506 are all fixedly mounted on a collimator base 505, like a fixed guide 102, and thus the path of light for measurement of the attitude of the alignment unit 111 can be held fixed.

The control of the alignment operation in this embodiment is similar to that in the first embodiment. But, in the detection of a change in attitude of the alignment unit 111, where the quantity of rotation wy (wz) is to be detected by using reflection light from one reflecting portion (e.g. X-axis reflecting portion 121), the opening/closing state of the shutters 506 and 507 is controlled so as to prevent interference by reflection light from the other reflecting portion (e.g. Y-axis reflecting portion 122). FIG. 5 shows a case wherein the rotation wx is going to be detected by using reflection light from the Y-axis reflecting portion 122, and the shutter 506 is closed while the shutter 507 is opened.

Figure 6A:
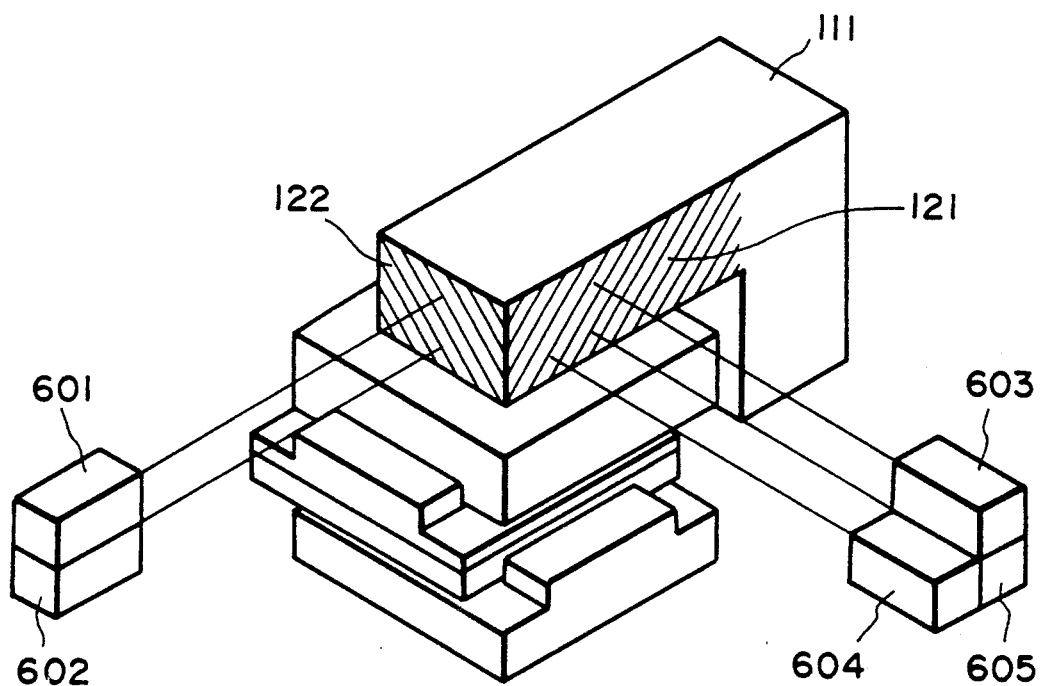
FIG. 6A is a perspective view showing a main structural portion of a fourth embodiment according to the present invention.
Figure 6B:
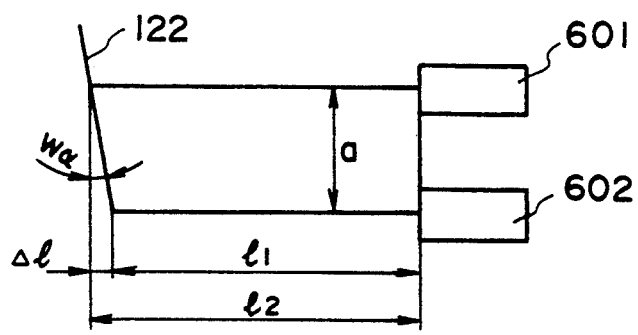
FIG. 6B is a representation for explaining the operational principle of the fourth embodiment of the present invention.

FIG. 6A is a perspective view showing a main structural portion of a fourth embodiment of the present invention, and FIG. 6B is a schematic representation for explaining the principle of operation of the fourth embodiment.

In this embodiment, the alignment unit measuring means for detecting a change in attitude of the alignment unit 111 comprises five laser distance measuring devices 601–605. FIG. 6 shows only such portion as necessary for the attitude change detection.

The laser distance measuring devices 601 and 602 are disposed opposed to a Y-axis reflecting portion 122 of the alignment unit 111, while the laser distance measuring devices 603–605 are disposed opposed to an X-axis reflecting portion 121 of the alignment unit 111. These laser distance measuring devices 601–605 are fixedly mounted on a base (not shown) together with a mask holder (not shown), and they are so set that the same distance is detected by them when each of rotational quantities wx, wy and wz of the alignment unit 111 is equal to zero. In the present embodiment. the rotational quantity wx is detected on the basis of the results of detection by the laser distance measuring devices 601 and 602, and the rotational quantity wy Is detected on the basis of the results of detection by the laser distance measuring devices 603 and 605, while the rotational quantity wz is detected on the basis of the results of detection by the laser distance measuring devices 604 and 605.

Referring to FIG. 6B, the principle of detecting each rotational quantity in this embodiment will be explained.

FIG. 6B is a schematic view and shows the detection of a rotational quantity wx through laser distance measuring devices 601 and 602. If the distance to the Y-axis reflecting portion 122 as measured by the laser distance measuring device 601 is l2, the distance to the Y-axis reflecting portion 122 as measured by the laser distance measuring device 602 is l1 wherein the difference between l2 and l1 is $\Delta l$, and if the spacing between the two laser distance measuring devices 601 and 602 is a, then the rotational quantity wx of the alignment unit 111 is $\tan w\alpha = \Delta l/a$.

In the present embodiment, not only the rotational quantities wx, wy and wz of the alignment unit 111 but also the absolute position of the alignment unit 111 can be detected. This provides the following advantages.

The alignment unit 111 is moved through the movable guides 101 and 105 (FIG. 1) in the X and Y directions, and the amount of movement is detected by linear encoder means provided therein. If, therefore, the pitch of a feed screw or the like has an error, there occurs an error (difference) between the amount of actual movement and the amount of movement desired. As a result, the alignment unit 111 is displaced to a position different from a position desired. On the other hand, the beam spot of the alignment beam 108 (FIG. 1) for effecting the alignment detection has a size which is larger than that of an alignment mark formed on a mask or a wafer. For this reason, even if the amount of movement of the alignment unit 111 contains an error, the alignment operation is still continued unless due to the error the alignment beam fails to impinge on the alignment mark. This results in inaccurate alignment.

Since in the present embodiment the absolute position of the alignment unit 111 can be detected, it is possible to avoid such inconveniences as described.

Figure 7:
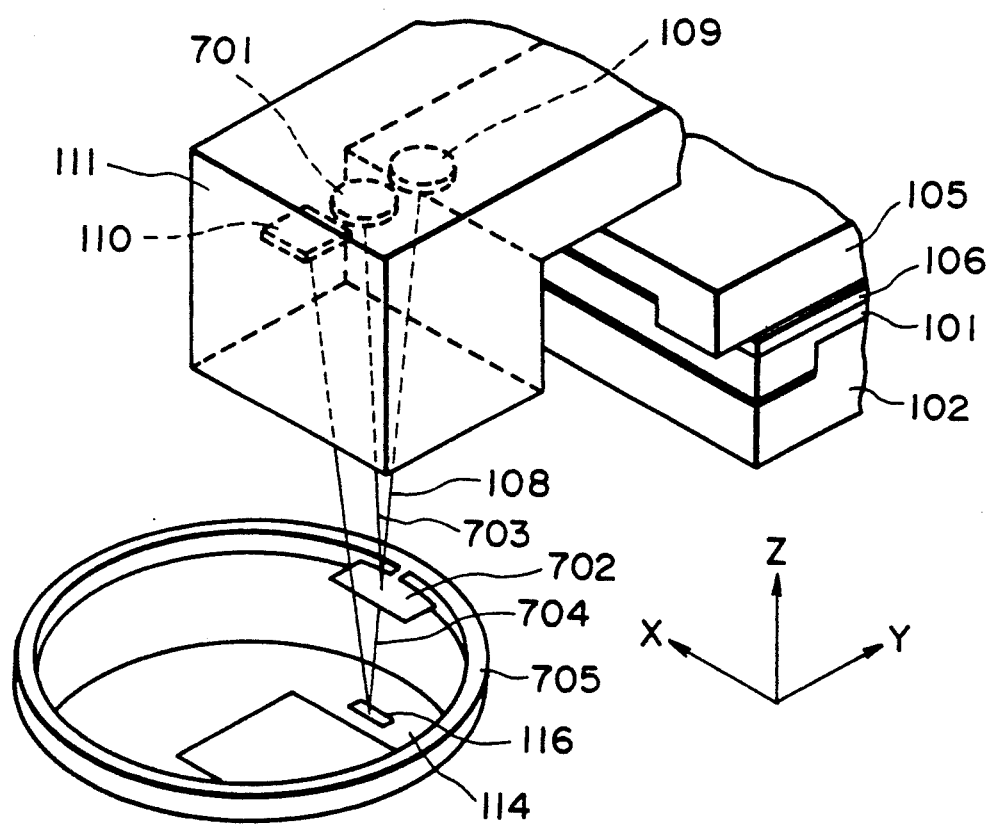
FIG. 7 is a perspective view showing a main structural portion of a fifth embodiment according to the present invention.

FIG. 7 is a perspective view showing a main structural portion of a fifth embodiment of the present invention.

In this embodiment, the attitude of the alignment unit 111 is measured by using the alignment beam 108.

The alignment unit 111 of this embodiment accommodates therein a laser diode 109 and an alignment signal detecting sensor 110 as well as an attitude detecting sensor 701 of a structure similar to the alignment signal detecting sensor 110. Further, on the path of an alignment beam 108 emanating from the laser diode 109, there is a half mirror 702 which is provided integrally with a mask holder 705. Reflection light 703 of the alignment beam 108 reflected by the half mirror impinges on the attitude detecting sensor 701, in response to which any change in attitude of the alignment unit 111 with reference to the mask holder 705 can be detected. On the other hand, transmission light 704 of the alignment beam passed through the half mirror 702 goes through an alignment mark 113 of a mask 112 (not shown in this drawing) and an alignment mark 116 of a wafer 114 and it is incident on the alignment signal detecting sensor 110, whereby alignment detection can be effected.

In this embodiment as described, the laser diode 109 and the attitude detecting sensor 701 as well as the half mirror 702 cooperate with each other to provide an alignment unit measuring means.

In the present embodiment, any change in attitude of the alignment unit 111 with reference to the mask holder 705 can be detected. Additionally, from the positional relationship among the light projecting portion, the light receiving portion and the mask and from the angle of reflection, the distance of them can be detected.

While in the present embodiment the half mirror 702 is provided integrally with the mask holder 705, a movable mechanism may be provided to the half mirror so that the mirror may be retracted when the alignment detection is effected. Alternatively, the half mirror may be replaced by a thin-film device such as a liquid crystal film whose light transmitting state can be changed electrically.

Figure 8:
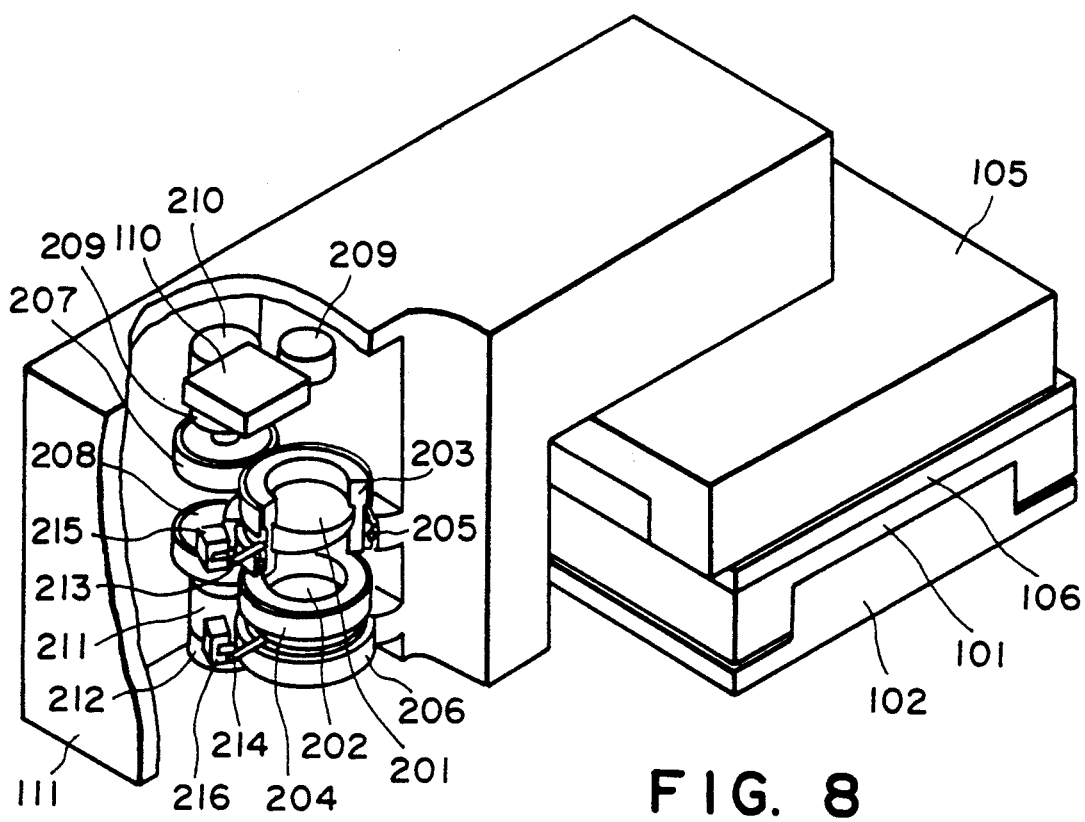
FIG. 8 is a perspective view showing a main structural portion of a sixth embodiment according to the present invention.
Figure 9:
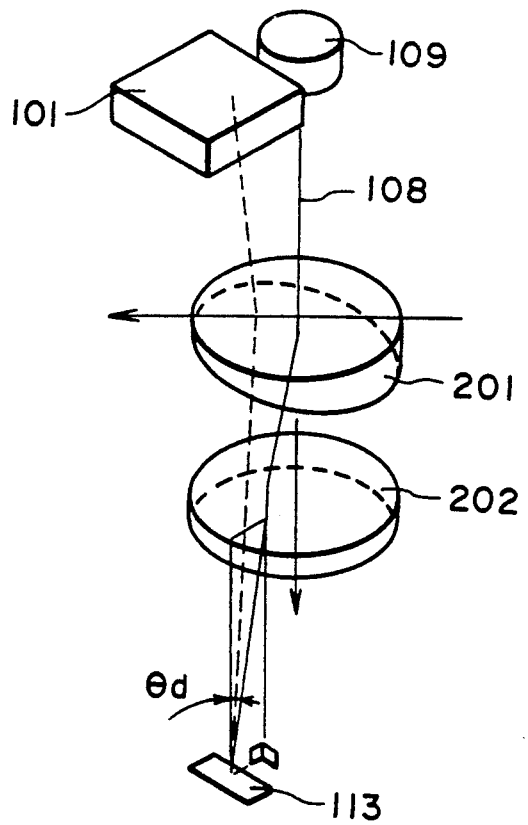
FIG. 9 is a perspective view showing the optical arrangement of the FIG. 8 embodiment.
Figure 10:
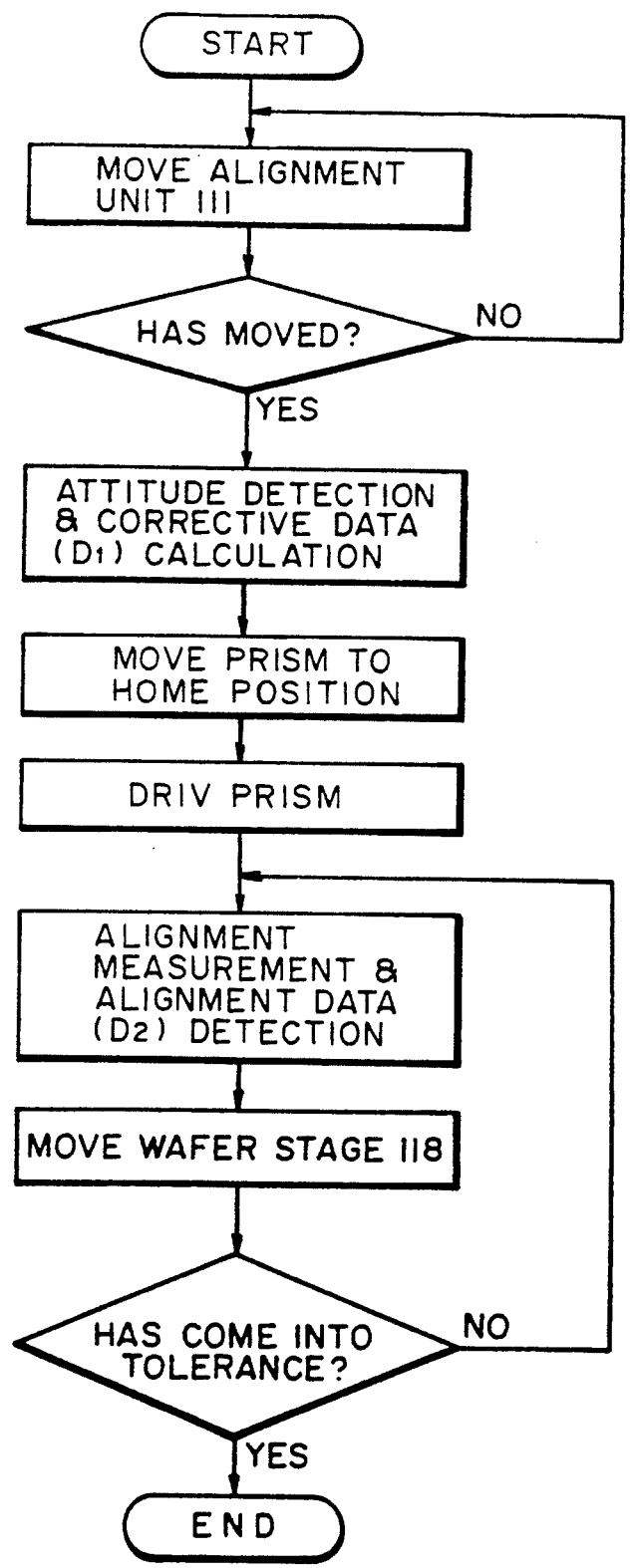
FIG. 10 is a flow chart for explaining the operation of the FIG. 8 embodiment.

FIG. 8 is a perspective view showing a main structural portion of a sixth embodiment of the present invention. FIG. 9 is a perspective view showing optical arrangement of the main structural portion and FIG. 10 is a flow chart for explaining the control operation of this embodiment.

In this embodiment, an inclination adjusting means is provided to correct any inclination the alignment caused by inclination of the alignment unit 111.

The alignment unit 111 accommodates therein a first wedge prism 201 having an apex angle $\theta w1$ and a second wedge prism 202 having an apex angle $\theta w2$. The first wedge prism 201 is held by a barrel 230 having a gear means formed at an end thereof. The barrel 203 is supported by the alignment unit 111 through a bearing means 205. The gear means of the barrel 203 engages with a driving gear 207 and it is coupled with an actuator 209 with an encoder 210.

The second wedge prism 202 is held by a barrel 204, in the same manner as the first wedge prism 201. The barrel 204 has a gear means which engages with a gear 208 coupled to actuators 211 and 212, and the drive is transmitted through the same.

These barrels have blocking blades 213 and 214 each being movable with rotation of corresponding one of the wedge prisms. The alignment unit 111 is further provided with photoswitches 215 and 216, and each of the blocking blades 213 and 214 serves to change the light blocking/projecting state of a corresponding one of the photoswitches.

The operation of this embodiment will now be explained.

General optical arrangement and light paths of this embodiment are such as shown in FIG. 9. Alignment beam 108 emanating from a laser diode 109 enters the first wedge prism 201 and emanates therefrom with a deflection angle $(n1-1)\theta w1$ (wherein n is the refractive index of the wedge prism 201), and it is incident on the second wedge prism 202. Then the light beam is refracted by the second wedge prism 202 and, after passing through an alignment beam optical system (not shown), it is projected on an alignment mark 113 with a deflection angle $\theta d$. The alignment beam 108 reflected back through the alignment marks 113 and 116 goes along a path depicted by a broken line in the drawing, and it is received by an alignment signal sensor 110. Thus, a signal is detected.

In response to the reception of light, each of the wedge prisms 201 and 201 serves in principle to provide a deflection angle in a direction of the axis but not to provide a deflection angle in a direction perpendicular to the axis direction. Thus, when the two wedge prisms are relatively rotationally moved to provide a difference in the direction of the axis therebetween, the angle of incidence in the axis direction of the second wedge prism changes, and the deflection angle $\theta d$ of the light emanating from the second wedge prism 202 and impinging on the alignment mark 113 changes.

Figure 11:
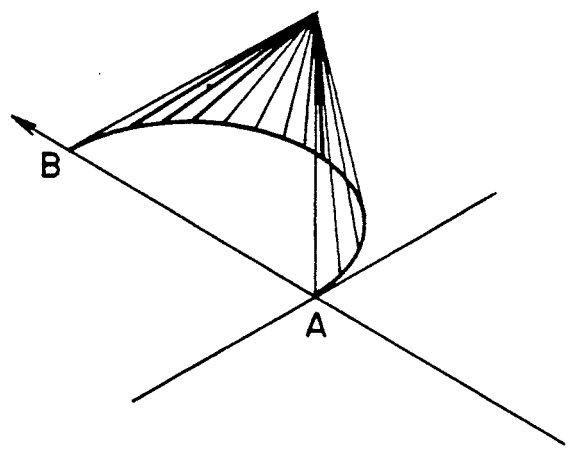
FIG. 11 is a perspective view schematically showing changes in light projecting point of an alignment beam in the FIG. 8 embodiment.

Now, if the first wedge prism 201 is held fixed and the second wedge prism 202 is rotated, the point of projection of the alignment beam changes such as shown in FIG. 11. FIG. 11 is an example wherein, for simplicity, the laser beam 108 emanating from the laser diode 109 impinges on the first wedge prism 201 perpendicularly and wherein the light receiving surface of the first wedge prism (upper surface in the drawing) is placed parallel to the light receiving surface of the second wedge prism (upper surface in the drawing). It is to be noted here that this optical arrangement is advantageous also with respect to the preparation of a rotation corrective table for the wedge prism, to be described later in relation to the control operation.

The direction as depicted by an arrow in the figure corresponds to the direction of the axis of the first wedge prism. When the two wedge prisms have their axes oriented in opposite directions of 180 degrees, the alignment beam 108 is projected on a point A perpendicularly. If, on the other hand, the second wedge prism 202 rotates by 180 degrees and the axes of the two wedge prisms are aligned with each other, the alignment beam 108 is projected on a point B. Here, the deflection angle is $2\theta d$.

The alignment unit 111 is provided with an X-axis reflecting portion 121 (a surface perpendicular to the X axis) and a Y-axis reflecting portion 122 (a surface perpendicular to the Y axis). Two auto-collimators 123 and 124 are disposed opposed to these two reflecting portions, respectively. With regard to a change in attitude of the alignment unit 111, one of the auto-collimators which is opposed to the X-axis reflecting portion serves to detect a rotational quantity wy about the Y axis as well as a rotational quantity wz about the Z axis. On the other hand, the other auto-collimator which is opposed to the Y-axis reflecting portion serves to detect a rotational quantity wx about the X axis. These auto-collimators are mounted on a collimator base (not shown) provided integrally with a mask holder and fixedly within the exposure apparatus.

The alignment unit 111 accommodates therein a laser diode 108 which is a light source for the alignment beam 108 and an alignment signal detecting sensor 110 as well as an alignment unit attitude change detecting sensor 701. Further, on the path of the alignment beam 108, there is a half mirror 702 provided integrally with a mask holder 705. Reflection light 703 of the alignment beam 108 reflected by the half mirror 702 impinges on the attitude detecting sensor 701, in response to which any change in attitude of the alignment unit 111 with reference to the mask holder 705 can be detected. On the other hand, transmission light 704 of the alignment beam passed through the half mirror 702 goes through an alignment mark 113 of a mask 112 (not shown in this drawing) and an alignment mark 116 of a wafer 114 and it is incident on the alignment signal detecting sensor 110, whereby alignment detection can be effected.

In this embodiment as described, the laser diode 109 and the attitude detecting sensor 701 as well as the half mirror 702 cooperate with each other to provide an alignment unit measuring means.

A change in attitude of the alignment unit 111 appears as the position of incidence of the reflection light 701 upon the attitude detecting sensor 701. More specifically, if there occurs a change in attitude of the alignment unit 111 in the wx direction, the position of incidence of the reflection light 703 displaced in the Y direction. Similarly, a change in attitude in the wy direction causes displacement of the position of incidence of the reflection light in the X direction. Also, a change in attitude in the wz direction causes displacement of the position of incidence of the reflection light 703 in both of the X and Y directions. When the position of incidence of the reflection light 703 as the alignment unit 111 is inclined is detected, with reference to the position of incidence of the same reflection light as the alignment unit 111 projects the alignment beam at a correct or preset angle, the difference obtained results from the change in attitude of the alignment unit 111. If the change is attitude is denoted by $\theta x$ and the distance between the light emitting/receiving portion and the half mirror 702 is denoted by l, then the displacement $\Delta ly$ of the beam spot on the attitude detecting sensor 701 is given by the following equation:

$$\Delta ly = l \times \theta x$$

An example of the control to be performed in this embodiment will now be explained by reference to FIG. 10.

In response to the start of the alignment operation, the alignment unit 111 moves to a preset position. In this state, a quantity D1' of change in the attitude of the alignment unit 111 is calculated in a similar manner as the FIG. 1 or 7 embodiment, whereby a corrective data is obtained. Each of the wedge prisms 201 and 202 is rotated by the corresponding actuator 209 or 211, clockwise or counterclockwise as is preset. The position as the blocking blade 213 (214) blocks the photoswitch 215 (216) corresponds to the home position of the wedge prism 201 (202). The repetition precision as the home position is detected by using a photoswitch only may be of an order of a few microns to ten microns. If control of a precision higher than a few micron precision is necessary, the precision of detection of the home position has to be enhanced. To this end, as an example, a signal may be triggered just at a moment as the photoswitch is blocked, and an output pulse of an encoder coupled to the actuator may determine the home position.

Subsequently, from the calculated quantity D1' and by using a rotation corrective table, the angle of rotation of each of the two wedge prisms 201 and 202 is calculated and then these wedge prisms are rotated by the obtained angles. After this, alignment detection is effected, whereby alignment data D2 is obtained. On the basis of this alignment data D2, the wafer stage 118 is then moved. Thereafter, whether the mask-to-wafer deviation is within a range of tolerance is checked and, if it is so, the operation is finished. If not, the drive of the wafer stage 118 is repeated after the alignment detection.

In the present embodiment, any inclination of the alignment beam resulting from the inclination of the alignment unit 111 can be detected and corrected. Therefore, the alignment beam can be projected on an alignment mark always at a constant angle. This effectively assures further enhancement of the positioning precision.

Figure 12:
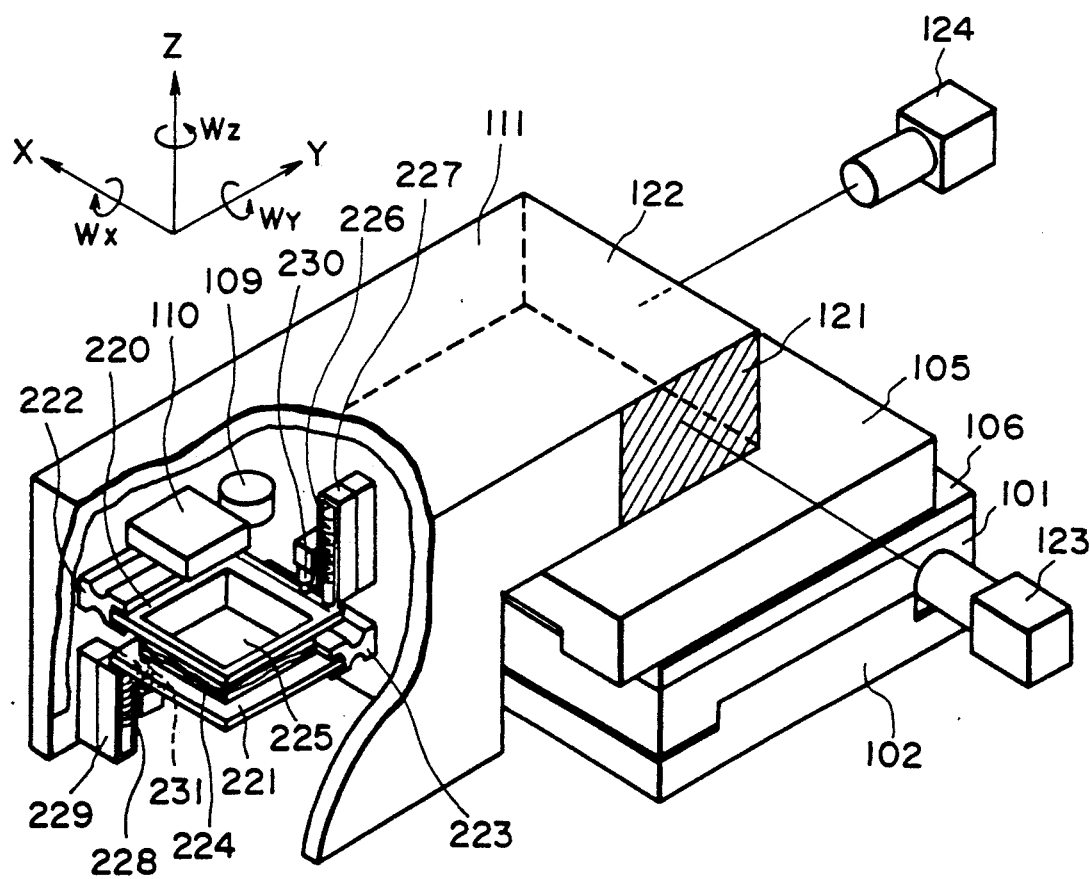
FIG. 12 is a perspective view showing a main structural portion of a seventh embodiment according to the present invention.

FIG. 12 is a perspective view showing a main structural portion of a seventh embodiment of the present invention. In this embodiment, an inclination adjusting means is provided to correct any inclination of the alignment beam as the alignment unit 111 is inclined.

More specifically, the alignment unit 111 of this embodiment accommodates therein an alignment beam inclination adjusting means of a structure to be described below.

Parallel flat plates 220 and 221 each is made of a material which is transmissive to the alignment beam. Between the two parallel plates 220 and 221, a sealing member 224 is interposed. The sealing member 224 is made of a material which is soft enough not to obstruct motion of the parallel plates 220 and 221. The parallel plates 220 and 221 as well as the sealing member 224 cooperate to define a closed space which is filled with a silicon oil as denoted at 225. The first parallel plate 220 is supported by the alignment unit 111 through a resilient hinge 222, and it is displaceable in the wy direction. The second parallel plate 221 is supported through a resilient hinge 223 for rotational displacement in the wx direction. Denoted at 226 is an actuator for moving the first parallel plate 220 and, in this example, it comprises a PZT (piezoelectric) device. The PZT device 226 is supported at an end by the alignment unit 111 through a PZT device holder 227, and another end of the PZT device is supported fixedly by the first parallel plate 220. Denoted at 228 is another PZT device for moving the second parallel plate 221. It is supported at an end by a PZT device holder 229, and another end of it is supported fixedly by the second parallel plate 221.

Denoted at 230 is a sensor for measuring displacement of the first parallel plate 220 in the Z direction, which may be of known type such as, for example, a "River New" (trade name) available from Sinkawa Denki Kabushiki Kaisha, Japan. The sensor 230 has its main body portion fixed to the alignment unit 111 while it has its sensor head portion disposed opposed to the parallel plate 220. Denoted at 231 is a sensor for measuring displacement of the second parallel plate 221 in the Z direction. It has its main body portion fixed to the alignment unit 111 while it has its sensor head portion disposed opposed to the parallel plate 221.

The operation of this embodiment will now be explained.

The laser alignment beam emanating from the laser diode 109 goes through the first parallel plate 220, the silicon oil and the second parallel plate 221, and it impinges on an alignment mark 113. After this, the alignment beam impinges on another alignment mark 116. The alignment beam 108 as reflected back goes again through the second parallel plate, the silicon oil and the first parallel plate in this order, and it is received by the alignment signal detecting sensor 110. Thus, a signal is detected.

If the two parallel plates are disposed exactly in parallel to each other, the angle of projection (emission) of the alignment beam at both sides of the parallel plates is the same. If a voltage is applied to the PZT device 226 to displace the first parallel plate 220, then the alignment beam, emanating from the second parallel plate 221 bears the inclination in the wy direction. Similarly, if the second parallel plate 221 is displaced by the PZT device 228, then the alignment beam emanating from the second parallel plate inclines in the wx direction.

The magnitude of inclination of the alignment beam can be detected from the angle of the parallel plate and the refractive index of the silicon oil as well as that of the parallel plate. Although the refractive index of a silicon oil may change with the temperature, where the positioning mechanism of the present invention is incorporated into an exposure apparatus which is operated in a constant temperature ambience, such a change in refractive index is very small and can be neglected. If the positioning mechanism of the present invention is to be used in a temperature varying ambience where precise beam angle control is required, an appropriate temperature control means may be used for the silicon oil used.

In response to start of the alignment operation, the alignment unit 111 is moved to a preset position. In this state, a quantity D1' of change in attitude of the alignment unit 111 is calculated, whereby a corrective data is obtained. As regards the quantity D1', a change in the wx direction is corrected by tilting the second parallel plate 221 through a quantity $\Delta\theta x$ by means of the PZT device 228 in a direction cancelling that change. Similarly, a change in the wy direction is corrected by tilting the first parallel plate 220 through a quantity $\Delta\theta y$ by means of the PZT device 226 in a direction cancelling that change. As regards the wz component, if the alignment beam 108 is projected on an alignment mark perpendicularly, it does not cause an angular error. If the alignment beam 108 is projected with a certain angle, then the wz component is dissolved into wx and wy components and the thus obtained wx and wy components are corrected by using the parallel plates 202 and 201, respectively.

After correction of the angle of projection of the alignment beam 108, the alignment measurement is effected whereby alignment data D2 is obtained. On the basis of this alignment data D2, the wafer stage 118 is moved. Then, whether the mask-to-wafer deviation is within a range of tolerance is checked. If so, then the operation is finished. If not, the drive of the wafer stage 118 is repeated after the alignment measurement.

In accordance with this embodiment of the present invention, any inclination of the alignment beam resulting from inclination of the alignment unit can be detected and corrected. Therefore, the alignment beam can be projected upon an alignment mark always at a constant angle. This effectively assures enhanced positioning precision.

While the invention has been described with reference to the structures disclosed herein, it is not confined to the details set forth and this application is intended to cover such modifications or changes as may come within the purposes of the improvements or the scope of the following claims.

What is claimed is:

1. An alignment method wherein alignment detection for a mask and a wafer is effected by using an alignment beam projected from an alignment detection unit, said method comprising the steps of:
    detecting the attitude of the alignment detection unit;
    adjusting an angle of projection of the alignment beam on the basis of said attitude detection; and
    effecting alignment detection for the mask and the wafer by using the angle-adjusted alignment beam.

2. A method according to claim 1, wherein the attitude of the alignment detection unit is detected by projecting a beam, different from the alignment beam, to the alignment detection unit.

3. A method according to claim 1, wherein said projection angle adjustment is effected by adjusting the attitude of the alignment detection unit.

4. A method according to claim 1, wherein said projection angle adjustment is effected by means of an optical member which is influential to the alignment beam.

5. A method according to claim 1, wherein the attitude of the alignment detection unit is detected on the basis of the alignment beam.

6. An alignment system, comprising:
    an alignment detection unit for effecting alignment detection for a mask and a wafer by using an alignment beam;
    detecting means for detecting the attitude of said alignment detection unit, wherein for the attitude detection said detecting means projects a beam, different from the alignment beam, to said alignment detection unit; and
    adjusting means for adjusting an angle of the alignment beam on the basis of the attitude detection.

7. A system according to claim 6, wherein said detecting means comprises at least one of an auto-collimator and a laser distance gauge.

8. A system according to claim 6, wherein, for the angle adjustment, said adjusting means adjusts the attitude of said alignment detection unit.

9. A system according to claim 6, wherein said adjusting means comprises an optical member which is influential to the alignment beam.

10. A semiconductor device manufacturing method to be used with a mask having a pattern, a wafer and an alignment detection unit, said method comprising the steps of:
    detecting the attitude of the alignment detection unit;
    adjusting an angle of projection of an alignment beam to be projected from the alignment detection unit, on the basis of said attitude detection;
    effecting alignment detection for the mask and the wafer by using the angle-adjusted alignment beam; and
    adjusting the positional relationship between the mask and the wafer on the basis of said alignment detection.

11. A semiconductor device manufacturing system, comprising:
    first holding means for holding a mask having a pattern;
    second holding means for holding a wafer;
    stage means for adjusting the positional relationship between the mask and the wafer held by said first and second holding means, respectively;
    an alignment detection unit for effecting alignment detection for the mask and the wafer by using an alignment beam;
    detecting means for detecting the attitude of said alignment detection unit, wherein for the attitude detection said detecting means projects a beam, different from the alignment beam, to said alignment detection unit; and
    adjusting means for adjusting an angle of the alignment beam on the basis of the attitude detection.

* * * * *

UNITED STATES PATENT AND TRADEMARK OFFICE
CERTIFICATE OF CORRECTION

PATENT NO. : 5,225,686
DATED : July 6, 1993
INVENTOR(S) : RYO EDO

It is certified that error appears in the above-indentified patent and that said Letters Patent is hereby corrected as shown below: On the title page, Item

[56] REFERENCES CITED
Foreign Patent Documents," 1193689 8/1989 Japan" should read --1-193689 8/1989 Japan--.

[57] ABSTRACT
Line 6, "o" should read --on--.
Line 7, "t he" should read --the--.

IN THE DRAWINGS
Sheet 9, Figure 10, "DRIV" should read --DRIVE--.

COLUMN 1
Line 31, "relationship" should read --positional relationship--.
Line 58, "at" should read --denoted at--.

COLUMN 2
Line 13, "displaced" should read --is displaced--.

COLUMN 4
Line 44, "spot" should read --spot is--.

COLUMN 5
Line 9, "start of a" should read --a start of the--.
Line 31, "ar" should read --are--.
Line 47, "is" should read --is a--.

COLUMN 7
Line 30, "Is" should read --is--.

UNITED STATES PATENT AND TRADEMARK OFFICE
CERTIFICATE OF CORRECTION

PATENT NO. : 5,225,686
DATED : July 6, 1993
INVENTOR(S) : RYO EDO

It is certified that error appears in the above-indentified patent and that said Letters Patent is hereby corrected as shown below:

COLUMN 9
Line 28, "201" (second occurrence) should read --202--.

COLUMN 10
Line 32, "light 701" should read --light 703--.
Line 36, "displaced" should read --is displaced.
Line 49, "is" (first occurrence) should read --in--.
Line 63, "as" should read --as in--.

COLUMN 12
Line 43, "to" should read --to the--.

Signed and Sealed this

Twelfth Day of April, 1994

Attest:

BRUCE LEHMAN

Attesting Officer

Commissioner of Patents and Trademarks